(12) United States Patent
Aziz et al.

(10) Patent No.: US 8,487,527 B2
(45) Date of Patent: Jul. 16, 2013

(54) ORGANIC LIGHT EMITTING DEVICES

(75) Inventors: Hany Aziz, Oakville (CA); Zoran D. Popovic, Mississauga (CA); Jennifer A. Coggan, Cambridge (CA); Nan-Xing Hu, Oakville (CA)

(73) Assignee: LG Display Co., Ltd., Seoul (KR)

( * ) Notice: Subject to any disclaimer, the term of this patent is extended or adjusted under 35 U.S.C. 154(b) by 600 days.

(21) Appl. No.: 11/122,288

(22) Filed: May 4, 2005

(65) Prior Publication Data

US 2006/0251919 A1     Nov. 9, 2006

(51) Int. Cl.
*H01L 51/54* (2006.01)
*H01L 51/50* (2006.01)
*C09K 11/06* (2006.01)
*H05B 33/14* (2006.01)

(52) U.S. Cl.
USPC ........... 313/504; 313/506; 428/690; 428/917; 257/40; 257/E51.047

(58) Field of Classification Search
None
See application file for complete search history.

(56) References Cited

U.S. PATENT DOCUMENTS

| | | | |
|---|---|---|---|
| 2,832,905 A | 4/1958 | Clay | |
| 3,172,862 A | 3/1965 | Gurnee et al. | |
| 3,598,644 A | 8/1971 | Goffe et al. | |
| 4,084,966 A | 4/1978 | Haas et al. | |
| 4,287,449 A | 9/1981 | Takeda et al. | |
| 4,356,429 A | 10/1982 | Tang | |
| 4,539,507 A | 9/1985 | VanSlyke et al. | |
| 4,652,794 A | 3/1987 | Waite et al. | |
| 4,665,115 A | 5/1987 | Lundberg et al. | |
| 4,720,432 A | 1/1988 | VanSlyke et al. | |
| 4,769,292 A * | 9/1988 | Tang et al. ............. | 428/690 |
| 4,885,211 A | 12/1989 | Tang et al. | |
| 5,049,780 A | 9/1991 | Dobrowolski et al. | |
| 5,059,861 A | 10/1991 | Littman et al. | |
| 5,141,671 A | 8/1992 | Bryan et al. | |
| 5,150,006 A | 9/1992 | Van Slyke et al. | |
| 5,151,629 A | 9/1992 | VanSlyke | |
| 5,227,252 A | 7/1993 | Murayama et al. | |
| 5,247,190 A | 9/1993 | Friend et al. | |
| 5,276,381 A | 1/1994 | Wakimoto et al. | |
| 5,409,783 A | 4/1995 | Tang et al. | |
| 5,429,884 A | 7/1995 | Namiki et al. | |
| 5,457,565 A | 10/1995 | Namiki et al. | |

(Continued)

FOREIGN PATENT DOCUMENTS

| EP | 0 831 676 | 3/1998 |
|---|---|---|
| EP | 0855848 | 7/1998 |

(Continued)

OTHER PUBLICATIONS

Liu et al., Current Applied Physics, (2005), vol. 5, pp. 218-221.*

(Continued)

*Primary Examiner* — Jennifer Chriss
*Assistant Examiner* — Brett A Crouse
(74) *Attorney, Agent, or Firm* — McKenna Long & Aldridge LLP

(57) ABSTRACT

The present invention relates to organic light emitting devices (OLEDs) comprising an electroluminescent material layer comprising a mixture of at least two materials having different electron and hole transport capacities, and an electron transport layer comprising a triazine. Display devices comprising the OLEDs are also disclosed.

1 Claim, 1 Drawing Sheet

U.S. PATENT DOCUMENTS

| | | |
|---|---|---|
| 5,516,577 A | 5/1996 | Matsuura et al. |
| 5,593,788 A | 1/1997 | Shi et al. |
| 5,601,903 A | 2/1997 | Fujii et al. |
| 5,608,287 A | 3/1997 | Hung et al. |
| 5,703,436 A | 12/1997 | Forrest et al. |
| 5,707,745 A | 1/1998 | Forrest et al. |
| 5,719,467 A | 2/1998 | Antoniadis et al. |
| 5,728,801 A | 3/1998 | Wu et al. |
| 5,739,635 A | 4/1998 | Wakimoto |
| 5,776,622 A | 7/1998 | Hung et al. |
| 5,837,391 A | 11/1998 | Utsugi |
| 5,846,666 A | 12/1998 | Hu et al. |
| 5,853,905 A | 12/1998 | So et al. |
| 5,925,472 A | 7/1999 | Hu et al. |
| 5,925,980 A | 7/1999 | So et al. |
| 5,935,720 A | 8/1999 | Chen et al. |
| 5,935,721 A | 8/1999 | Shi et al. |
| 5,942,340 A | 8/1999 | Hu et al. |
| 5,952,115 A | 9/1999 | Hu et al. |
| 5,955,836 A | 9/1999 | Boerner et al. |
| 5,972,247 A | 10/1999 | Shi et al. |
| 6,013,384 A | 1/2000 | Kido et al. |
| 6,023,073 A | 2/2000 | Strite |
| 6,028,327 A | 2/2000 | Mizoguchi et al. |
| 6,057,048 A | 5/2000 | Hu et al. |
| 6,105,202 A | 8/2000 | Grasso et al. |
| 6,107,734 A | 8/2000 | Tanaka et al. |
| 6,130,001 A | 10/2000 | Shi et al. |
| 6,225,467 B1 | 5/2001 | Esteghamatian et al. |
| 6,229,012 B1 | 5/2001 | Hu et al. |
| 6,274,980 B1 | 8/2001 | Burrows et al. |
| 6,303,250 B1 | 10/2001 | Watanabe et al. |
| 6,392,250 B1 | 5/2002 | Aziz et al. |
| 6,392,339 B1 | 5/2002 | Aziz |
| 6,423,429 B2 | 7/2002 | Kido et al. |
| 6,437,123 B1 | 8/2002 | Bock et al. |
| 6,465,115 B2 | 10/2002 | Shi et al. |
| 6,479,172 B2 | 11/2002 | Hu et al. |
| 6,562,485 B2 | 5/2003 | Hu et al. |
| 6,565,996 B2 | 5/2003 | Hatwar et al. |
| 6,614,175 B2 | 9/2003 | Aziz et al. |
| 6,639,357 B1 | 10/2003 | Parthasarathy et al. |
| 6,717,358 B1 | 4/2004 | Liao et al. |
| 6,734,625 B2 | 5/2004 | Vong et al. |
| 6,737,177 B2 | 5/2004 | Aziz et al. |
| 6,740,429 B2 | 5/2004 | Aziz et al. |
| 6,750,609 B2 | 6/2004 | Aziz et al. |
| 6,753,098 B2 | 6/2004 | Aziz et al. |
| 6,759,146 B2 | 7/2004 | Aziz et al. |
| 6,765,348 B2 | 7/2004 | Aziz et al. |
| 6,773,830 B2 | 8/2004 | Aziz et al. |
| 6,821,643 B1 | 11/2004 | Hu et al. |
| 6,841,932 B2 | 1/2005 | Aziz et al. |
| 7,083,490 B2 | 8/2006 | Mueller et al. |
| 7,211,948 B2 | 5/2007 | Liao et al |
| 7,288,887 B2 | 10/2007 | Aziz et al. |
| 7,291,404 B2 | 11/2007 | Aziz et al. |
| 7,351,999 B2 | 4/2008 | Li |
| 7,420,203 B2 | 9/2008 | Tsutsui et al. |
| 7,473,923 B2 | 1/2009 | Tsutsui et al. |
| 2002/0037398 A1 | 3/2002 | Tofuku et al. |
| 2002/0121860 A1 | 9/2002 | Seo et al. |
| 2002/0135296 A1* | 9/2002 | Aziz et al. .............. 313/504 |
| 2002/0136922 A1* | 9/2002 | Sakai et al. .............. 428/690 |
| 2002/0145380 A1 | 10/2002 | Aziz et al. |
| 2002/0180349 A1 | 12/2002 | Aziz et al. |
| 2003/0071565 A1 | 4/2003 | Hatwar et al. |
| 2003/0087125 A1* | 5/2003 | Aziz et al. .............. 428/690 |
| 2003/0116772 A1 | 6/2003 | Yammazaki et al. |
| 2003/0127967 A1 | 7/2003 | Tsutsui et al. |
| 2003/0134146 A1 | 7/2003 | Aziz et al. |
| 2003/0170491 A1 | 9/2003 | Liao et al. |
| 2003/0189401 A1 | 10/2003 | Kido et al. |
| 2003/0230974 A1 | 12/2003 | Chang et al. |
| 2003/0234609 A1 | 12/2003 | Aziz et al. |
| 2004/0004433 A1 | 1/2004 | Lamansky et al. |
| 2004/0009418 A1 | 1/2004 | Main et al. |
| 2004/0018383 A1 | 1/2004 | Aziz et al. |
| 2004/0027059 A1 | 2/2004 | Tsutsui |
| 2004/0209184 A1 | 10/2004 | Hatakeyama et al. |
| 2004/0227460 A1 | 11/2004 | Liao et al. |
| 2004/0262615 A1 | 12/2004 | Cok |
| 2005/0064235 A1 | 3/2005 | Liao et al. |
| 2005/0088083 A1 | 4/2005 | Seo et al. |
| 2005/0100760 A1 | 5/2005 | Yokoyama |
| 2005/0112400 A1 | 5/2005 | Seo et al. |
| 2005/0140275 A1 | 6/2005 | Park |
| 2005/0175857 A1 | 8/2005 | Coggan et al. |
| 2006/0105202 A1 | 5/2006 | Kitamura |
| 2006/0139516 A1 | 6/2006 | Park |
| 2006/0139893 A1 | 6/2006 | Yoshimura et al. |
| 2006/0194076 A1 | 8/2006 | Nariyuki |
| 2006/0204783 A1* | 9/2006 | Conley et al. .............. 428/690 |
| 2006/0251919 A1 | 11/2006 | Aziz et al. |
| 2006/0251920 A1 | 11/2006 | Aziz et al. |
| 2006/0261727 A1 | 11/2006 | Aziz et al. |
| 2006/0261731 A1 | 11/2006 | Aziz et al. |
| 2006/0263593 A1 | 11/2006 | Aziz et al. |
| 2006/0263628 A1 | 11/2006 | Aziz et al. |
| 2006/0263629 A1 | 11/2006 | Aziz et al. |
| 2006/0265278 A1 | 11/2006 | Dimeo |
| 2007/0182317 A1 | 8/2007 | Kido et al. |
| 2009/0045738 A1 | 2/2009 | Tsutsui et al. |

FOREIGN PATENT DOCUMENTS

| | | |
|---|---|---|
| EP | 09 77 287 A2 | 2/2000 |
| EP | 09 772 88 A2 | 2/2000 |
| EP | 1 009 044 A2 | 6/2000 |
| EP | 1010359 B1 | 6/2000 |
| EP | 1017118 A2 | 7/2000 |
| EP | 1 029 832 A1 | 8/2000 |
| EP | 1 160 890 A2 | 12/2001 |
| EP | 1167488 A1 | 1/2002 |
| EP | 1 311 139 A1 | 5/2003 |
| EP | 1311139 A1 | 5/2003 |
| EP | 1 339 112 A2 | 8/2003 |
| EP | 1 408 563 | 4/2004 |
| EP | 1 624 503 A2 | 2/2006 |
| EP | 1 624 504 A2 | 2/2006 |
| EP | 1 010 359 B1 | 4/2006 |
| JP | 04-230997 | 8/1992 |
| JP | 1993-217675 | 8/1993 |
| JP | 06-176870 | 6/1994 |
| JP | 8-222374 A | 8/1996 |
| JP | 09-188875 | 7/1997 |
| JP | 10-316904 | 12/1998 |
| JP | 11-312584 | 11/1999 |
| JP | 11-329749 | 11/1999 |
| JP | 2002-055203 A | 2/2002 |
| JP | 2003-045676 | 2/2003 |
| JP | 2003-086381 | 3/2003 |
| JP | 2003-151777 | 5/2003 |
| JP | 2004-039617 | 2/2004 |
| JP | 2004-095546 | 3/2004 |
| JP | 2004-139981 | 5/2004 |
| JP | 2004-317897 A | 11/2004 |
| JP | 2005-070574 | 3/2005 |
| JP | 2005-072012 | 3/2005 |
| JP | 2006-173550 | 6/2006 |
| JP | 2006-210845 | 8/2006 |
| WO | WO 96/19792 | 6/1996 |
| WO | WO 97/33296 A1 | 9/1997 |
| WO | WO 98/41065 A1 | 9/1998 |
| WO | WO 99/03158 | 1/1999 |
| WO | WO 00/30139 | 5/2000 |
| WO | WO 01/06816 A1 | 1/2001 |
| WO | WO 01/08240 A1 | 2/2001 |
| WO | WO 03055275 | 7/2003 |
| WO | WO 03 088718 A1 | 10/2003 |
| WO | WO/2004/068911 | 8/2004 |
| WO | WO 2005/037954 | 4/2005 |
| WO | WO 2006/033472 A1 | 3/2006 |
| WO | WO 2006/038573 A1 | 4/2006 |
| WO | WO 2006/076092 | 7/2006 |
| WO | WO 2006/076092 A1 | 7/2006 |

OTHER PUBLICATIONS

So et al., PS-C21, The Seventh International Symposium on Functional Electron Systems (2007). downloaded from the internet Jan. 16, 2010.*

Matsushima et al., Current Applied Physics, (2005), vol. 5, pp. 305-308.*

Webster's New World Dictionary, College Edition, (1962), p. 18.*

Aziz et al., "Reduced reflectance cathode for organic light-emitting devices using metal organic mixtures", Applied Physics Letters, vol. 83, No. 1, pp. 186-188 (2003).

Day et al., "The use of charge transfer interlayers to control hole injection in molecular organic light emitting diodes", Thin Solid Films, vol. 410, pp. 159-166 (Mar. 2002).

A. Gyoutoku et al., "An Organic Electroluminescent Dot-Matrix Display Using Carbon Underlayer", Synthetic Metals, vol. 91, pp. 73-75 (1997).

Baldo et al., "Highly efficient phosphorescent emission from organic electroluminescent devices," Letters to Nature, vol. 395, pp. 151-154 (1998).

Bernius et al., "Developmental Progress of Electroluminescent Polymeric Materials and Devices" Proceedings of SPIE Conference on Organic Light Emitting Materials and Devices III, Denver, Colo., vol. 3797, p. 129-137 (Jul. 1999).

Carter et al., "*Polymeric anodes for improved polymer light-emitting diode performance*", Appl. Phys. Lett. 70 (16), pp. 2067-2069 (Apr. 21, 1997).

Chengfeng Qiu et al., Comparative Study of Metal or Oxide Capped Indium-Tin Oxide Anodes for Organic Light-Emitting Diodes, Journal of Applied Physics, vol. 93, No. 6 pp. 3253-3257 (Mar. 15, 2003).

Chengfeng Qiu et al., "Praseodymium Oxide Coated Anode for Organic Light-Emitting Diode", Applied Physics Letters, vol. 80, No. 19, pp. 3485-3487 (May 13, 2002).

Chieh-Wei Chen et al., "Top-Emitting Organic Light-Emitting Devices Using Surface-Modified Ag Anode," Applied Physics Letters, vol. 83, No. 25, pp. 5127-5129 (Dec. 22, 2003).

Endo et al., "Organic Electroluminescent Devices with a Vacuum-Deposited Lewis-Acid-Doped Hole-Injecting Layer", Japanese Journal of Applied Physics, vol. 41, pp. L358-L360 (Mar. 2002).

Gardin et al., "Light-Absorption Phenomena in Novel Low-Reflectance Cathodes for Organic Light-Emitting Devices Utilizing Metal-Organic Mixtures", Advanced Materials, vol. 15, No. 23, pp. 2021-2024 (Dec. 2003).

Hongjin Jiang et al., "Improvement of Organic Light-Emitting Diodes Performance by the Insertion of a $Si_3N_4$ Layer", Thin Solid Films, vol. 363, pp. 25-29 (2000).

Hyun-Ouk Ha et al., "Improving the efficiency of organic electroluminescent devices by introducing an electron-accepting and thermally stable polymer", Optical Materials, vol. 21 pp. 165-168 (2002).

I-Min Chan et al., "Enhanced Hole Injections in Organic Light-Emitting Devices by Depositing Nickel Oxide on Indium Tin Oxide Anode," Applied Physics Letters, vol. 81, No. 10, pp. 1899-1901 (Sep. 2, 2002).

Kido et al., "White-Light-Emitting Organic Electroluminescent Device Using Lanthanide Complexes," Jpn. J. Appl. Phys., vol. 35, pp. L394-L396 (1996).

Kim et al., "*Anode material based on Zr-doped ZnO thin films for organic light-emitting diodes*", Appl. Phys. Lett., vol. 83, No. 18, pp. 3809-3811 (Nov. 3, 2003).

Kim et al., "*Molecular organic light-emitting diodes using highly conducting polymers as anodes*", Appl. Phys. Lett., vol. 80 No. 20, pp. 3844-3846 (May 20, 2002).

L.S. Hung et al., "Anode Modification of in Organic Light-Emitting Diodes by Low-Frequency Plasma Polymerization of CHF3", Applied Physics Letters, vol. 78, No. 5, pp. 673-675 (Jan. 29, 2001).

Liu et al., "Development of highly stable organic electroluminescent devices with a doped co-host emitter system", Current Applied Physics 5, pp. 218-221 (2005).

S. A. VanSlyke et al., "Organic Electroluminescent Devices with Improved Stability", Applied Physics Letters, vol. 69, No. 15, pp. 2160-2162 (Oct. 7, 1996).

S. Karg et al., "Increased Brightness and Lifetime of Polymer Light Emitting Diodes with Polyanilne Anodes", Synthetic Metals, vol. 80, pp. 111-117 (1996).

Soo-Jin Chua et al., "Stabilization of Electrode Migration in Polymer Electroluminescent Devices", Applied Physics Letters, vol. 81, No. 6, pp. 1119-1121 (Aug. 5, 2002).

Wenping Hu et al., "Lowering of Operational Voltage of Organic Electroluminescent Devices by Coating Indium Tin Oxide Electrodes with a Thin $CuO_x$ Layer", Applied Physics Letters, vol. 80, No. 15, pp. 2640-2641 (Apr. 15, 2002).

Yulong Shen et al., "Modification of Indium Tin Oxide for Improved Hole Injection in Organic Light Emitting Diodes," Advanced Materials, vol. 13, No. 16 pp. 1234-1238 (Aug. 16, 2001).

Z.B. Deng et al., "Enhanced Brightness and Efficiency in Organic Electroluminescent Devices Using $SiO_2$ Buffer Layers", Applied Physics Letters, vol. 74, No. 15, pp. 2227-2229 (Apr. 12, 1999).

Zugang et al., "*Organic thin film electroluminescent devices with ZnO:Al as the anode*", J. Phys.: Condens. Matter 8, pp. 3221-3228 (1996).

Choong et al.; "Organic Light Emitting Diodes With a Bipolar Transport Layer"; Applied Physics Letters; vol. 75, No. 2, Jul. 12, 1999, pp. 172-174.

Matsumoto, Toshio et al., Multiphoton Emission OLED: Structure and Property, IDW'03; Dec. 2003, pp. 1285-1288.

Welying Gao; Controlled p doping of the hole-transport molecular material N,N'=diphenyl-N,N'-bis(1-naphthyl)-1,1'-biphenyl-4,4'-diamine with Terafluorotetracyanoquinodimethane, Journal of Applied Physics, vol. 94, No. 1 (Jul. 1, 2003), pp. 359-366.

H. Michelle Grandia et al.; Light-Absorption Phenomena in Novel Low-Reflective Cathodes for Organic Light-Emitting Devices Utilizing Metal-Organic Mixtures; Advanced Materials, 2003, 15, No. 23; pp. 2021-2024.

J. Blochwitz et al., "Non-Polymeric OLEDs with a Doped Amorphous Hole Transport Layer and Operating Voltages Down to 3.2 V to Achieve 100 cd/m2", Synthetic Metals, 2002, vol. 127; pp. 169-173.

* cited by examiner

ORGANIC LIGHT EMITTING DEVICES

FIELD

The present disclosure relates to organic light emitting devices.

REFERENCES

Organic Light Emitting Devices (OLEDs) represent a promising technology for display applications. A conventional device structure comprises (1) a transparent front electrode, (2) a multi-organic-layer light emitting region (usually at least two layers) comprising at least a small-molecule or polymeric organic electroluminescent material, and (3) a back electrode. The OLED is usually laminated on a substrate. One of the front and back electrodes is an electron-injecting cathode, and the other is a hole-injecting anode. When a voltage is applied across the electrodes, light is emitted from the light emitting region and through the transparent front electrode to reach the observer. Conventionally, a light emitting region comprises (1) at least one electron transport material layer near the cathode, (2) at least one hole transport material layer near the anode, and (3) an electroluminescent material layer in between the hole transport layer and the electron transport layer.

A number of OLEDs have been prepared from a laminate of an organic luminescent material. Such devices include a single crystal material as the electroluminescent substance, such as single crystal anthracenes as described, for example, in U.S. Pat. No. 3,530,325 (the disclosure of which is incorporated herein by reference). These types of devices can require excitation voltages on the order of 100 volts or greater.

As discussed above, OLEDs are conventionally formed as multilayered structures. OLEDs with dual layer light emitting regions comprising one organic layer adjacent to the anode supporting hole transport, and another organic layer adjacent to the cathode supporting electron transport and acting as the electroluminescent region layer of the device are disclosed in U.S. Pat. Nos. 4,356,429; 4,539,507; 4,720,432, and 4,769,292 (the disclosures of which are incorporated herein by reference).

U.S. Pat. No. 4,769,292 discloses a conventional OLED with an electroluminescent material layer comprising a hole transport layer, an electroluminescent layer, and an electron transport layer in which a fluorescent dopant material is added to the emission layer. In other conventional OLED structures such as, for example, those described in U.S. Pat. No. 4,720,432, the OLED further comprises a buffer layer interposed between the hole transport layer and the anode. The combination of the hole transport layer and the buffer layer forms a dual-layer hole transport region. This is discussed in S. A. Van Slyke et al., "Organic Electroluminescent Devices with Improved Stability," Appl. Phys. Lett. 69, pp. 2160-2162 (1996) (the disclosure of which is incorporated herein by reference).

There have also been attempts to obtain electroluminescence from OLEDs containing mixed layers, for example, layers in which both the hole transport material and the emitting electron transport material are mixed together in one single layer. See, for example, Kido et al., "Organic Electroluminescent Devices Based On Molecularly Doped Polymers," Appl. Phys. Lett. 61, pp. 761-763 (1992); S. Naka et al., "Organic Electroluminescent Devices Using a Mixed Single Layer," Jpn. J. Appl. Phys. 33, pp. L1772-L1774 (1994); W. Wen et al., Appl. Phys. Lett. 71, 1302 (1997); and C. Wu et al., "Efficient Organic Electroluminescent Devices Using Single-Layer Doped Polymer Thin Films with Bipolar Carrier Transport Abilities", IEEE Transactions on Electron Devices 44, pp. 1269-1281 (1997). The light emitting material can be one of the hole transport and electron transport materials. According to one embodiment, there can be a third material in addition to the hole transport and electron transport materials, in which the third material emits light.

Other examples of OLEDs formed of a single organic layer comprising a hole transport material and an electron transport material can be found, for example, in U.S. Pat. Nos. 5,853,905; 5,925,980; 6,114,055 and 6,130,001 (the disclosures of which are all incorporated herein by reference). As indicated in the article by S. Naka et al., these single mixed layer OLEDs can be less efficient than multilayer organic light emitting devices. These devices, which include only a single mixed layer of a hole transport material, such as NPB (N,N'-di(naphthalene-1-yl)-N,N'-diphenyl-benzidine), and an emitting electron transport material, such as $AlQ_3$ (tris(8-hydroxyquinoline) aluminum), are unstable and have poor efficiency. The instability of these devices is believed to be caused by the direct contact between the electron transport material in the mixed layer and the hole injecting material, which results in (1) the formation of an unstable cationic electronic transport material, and (2) the instability of the mixed layer/cathode interface.

For commercial applications, it can be useful for OLED displays to demonstrate both high efficiency (e.g., to have a driving voltage less than 5V for a current density of 25 $mA/cm^2$), and sufficient operational stability (e.g., a half-life greater than 1000 hours for an initial brightness of at least 500 $cd/m^2$). Small-molecule OLEDs with low driving voltage have been demonstrated in the past (e.g., Huang et al., APL 80, 139, 2002). However, such OLEDs can lack sufficient operational stability, potentially rendering them unsuitable for commercial applications. By using mixed emitting layer OLEDs, high operational stability has been realized, and driving voltages often exceeded a certain voltage, for example 5V. There is a need for OLEDs that demonstrate both low driving voltage and sufficient operational stability.

SUMMARY

In accordance with various embodiments, there is disclosed herein organic light emitting device comprising (a) an anode, (b) a hole transport layer, (c) an electroluminescent material layer comprising at least two materials having different electron and hole transport capacities, (d) an electron transport layer comprising a triazine, and (e) a cathode, wherein said electroluminescent material layer has a thickness of less than 50 nm.

According to another aspect of the disclosure, there is provided a display comprising at least one organic light emitting device comprising (a) an anode, (b) a hole transport layer, (c) an electroluminescent material layer comprising at least two materials having different electron and hole transport capacities, (d) an electron transport layer comprising a triazine, and (e) a cathode, wherein said electroluminescent material layer has a thickness of less than 50 nm.

According to yet another aspect of the disclosure there is provided an organic light-emitting device comprising (a) an anode, (b) a hole transport layer, (c) an electroluminescent material layer comprising at least two of: (i) an electron transport material, (ii) a hole transport material, and (iii) a bipolar transport material, (d) an electron transport layer

DESCRIPTION OF VARIOUS EMBODIMENTS

Figure 1:
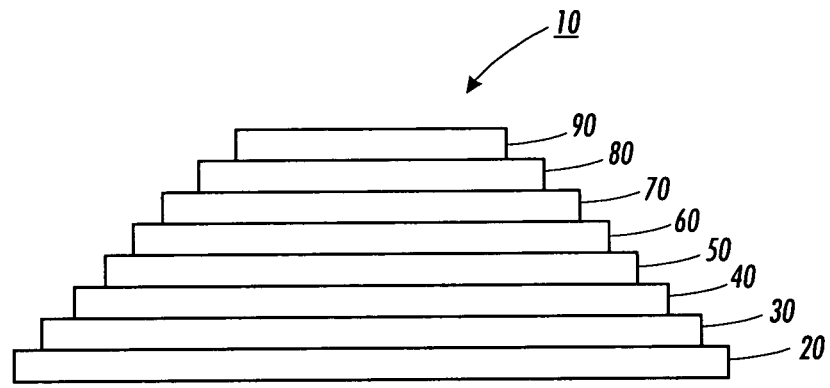
FIG. 1 illustrates an organic light emitting device in accordance with the present disclosure.
Figure 2:
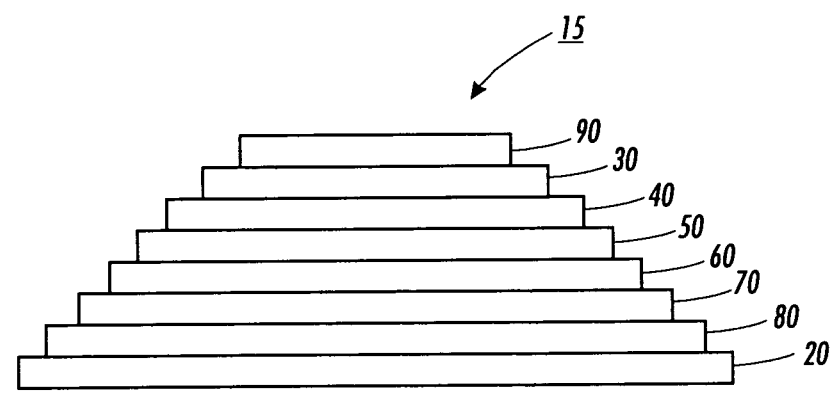
FIG. 2 illustrates another organic light emitting device in accordance with the present disclosure.

In an embodiment, and with reference to FIG. 1, an OLED 10 comprises in sequence a supporting substrate 20 of, for example, glass; an anode 30 of, for example, indium tin oxide in a thickness of from about 1 to about 500 nm, such as from about 30 to about 100 nm; an optional buffer layer 40 of, e.g., copper phthalocyanine, or plasma polymerized $CHF_3$ in a thickness from about 1 nm to about 300 nm; an organic hole transporting layer 50 of, for example, NPB in a thickness of from about 1 to about 200 nm, for example from about 5 to about 100 nm; an electroluminescent layer 60 comprised of, for example, a composition comprising a hole transport/electron transport/bipolar transport material, with the layer having a thickness of from about 5 to about 50 nm; an electron transporting layer 70 comprised of, for example, a triazine in a thickness of from about 5 to about 300 nm, for example from about 10 to about 100 nm, and in contact therewith a low work function metal cathode 80. An optional protective layer 90 can be formed on the cathode 80. According to another embodiment, and as illustrated in FIG. 2, in OLED 15 the supporting substrate 20 is adjacent to cathode 80, and optional protective layer 90 is adjacent to anode 30.

In various embodiments, OLEDs can comprise a supporting substrate 20. Illustrative examples of supporting substrates 20 include glass and the like, and polymeric components including polyesters like MYLAR®, polycarbonates, polyacrylates, polymethacrylates, polysulfones, quartz, and the like. Other substrates 20 may also be selected provided they can effectively support the other layers and do not interfere with the device functional performance. The thickness of substrate 20 can range, for example, from about 25 to about 1,000 μm or more, for example from about 50 to about 500 μm depending, for example, on the structural demands of the device.

According to various embodiments, the OLEDs can contain an anode 30, which can be contiguous to the substrate. Suitable non-limiting examples of anode 30 include positive charge injecting electrodes such as indium tin oxide, tin oxide, gold, platinum, or other suitable materials such as electrically conductive carbon, π-conjugated polymers such as polyaniline, polypyrrole, and the like with, for example, a work function equal to, or greater than about 4 eV (electron volts), and more specifically, from about 4 eV to about 6 eV. The thickness of the anode can range from about 1 to about 500 nm, with the suitable range being selected in view of the optical constants of the anode material. One suitable range of anode thickness is from about 30 to about 100 nm.

A buffer layer 40 can optionally be provided contiguous to the anode. The buffer layer, which can function to facilitate efficient injection of holes from the anode and to improve the adhesion between the anode and the hole transporting layer (thus further improving the device operation stability) includes conductive materials such as polyaniline and its acid-doped forms, polypyrrole, poly(phenylene vinylene), and known semiconductive organic materials; porphyrin derivatives disclosed in U.S. Pat. No. 4,356,429, the disclosure of which is totally incorporated herein by reference, such as 1,10,15,20-tetraphenyl-21H,23H-porphyrin copper (II); copper phthalocyanine, copper tetramethyl phthalocyanine; zinc phthalocyanine; titanium oxide phthalocyanine; magnesium phthalocyanine; and the like. The buffer layer can comprise a tertiary amine suitable as an electron hole transport material. The buffer layer can be prepared by forming one of the above compounds into a thin film by known methods, such as vapor deposition or spin coating. The thickness of the buffer layer thus formed is not particularly limited, and can range of from about 5 nm to about 300 nm, for example from about 10 nm to about 100 nm.

In various embodiments, the OLEDs can comprise a hole transport layer 50 comprising a hole transport material. Suitable non-limiting examples of hole transport materials include tertiary aromatic amines, like NPB; N,N'-diphenyl-N,N'-bis(3-methylphenyl)-1,1-biphenyl-4,4'-diamine) (TPD); N,N'-di(naphthalene-1-yl)-N,N'-diphenyl-benzidine) (NPB); N,N'-bis(p-biphenyl)-N,N'-diphenyl benzidine (BP-TPD), and the aromatic tertiary amines disclosed in U.S. Pat. No. 4,539,507, the disclosure of which is incorporated herein by reference. Examples of suitable aromatic tertiary amines include bis(4-dimethylamino-2-methylphenyl)phenylmethane; N,N,N-tri(p-tolyl)amine; 1,1-bis(4-di-p-tolylaminophenyl) cyclohexane; 1,1-bis(4-di-p-tolylaminophenyl)-4-phenyl cyclohexane; N,N'-diphenyl-N,N'-bis(3-methylphenyl)-1,1'-biphenyl-4,4'-diamine; N,N'-diphenyl-N,N'-bis(3-methylphenyl)-1,1'-biphenyl-4,4'-diamine; N,N'-diphenyl-N,N'-bis(4-methoxyphenyl)-1,1'-biphenyl-4,4'-diamine; N,N, N',N'tetra-p-tolyl-1,1'-biphenyl-4,4'-diamine; N,N'-di-1-naphthyl-N,N'-diphenyl-1,1'-biphenyl-4,4'-diamine; and the like.

Another class of aromatic tertiary amines suitable as hole transporting materials is the polynuclear aromatic amines, such as N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; and N,N-bis-[4'-(N-phenyl-N-m-tolylamino)-4-biphenylyl]-1-aminonaphthalene, and the like.

Additional hole transport materials useful for hole transport layer 50 include carbazoles like N,N'-dicarbazolyl-4-4'-biphenyl (CBP), 4,4'-bis(3,6-diphenyl carbazol-9-yl)-1,1'-biphenyl (TPCB), and 4,4'-bis(9-carbazolyl)-1,1'-biphenyl compounds. Illustrative examples of 4,4'-bis(9-carbazolyl)-1,1'-biphenyl compounds include 4,4'-bis(9-carbazolyl)-1,1'-biphenyl and 4,4'-bis(3-methyl-9-carbazolyl)-1,1'-biphenyl, and the like. Another class of suitable hole transport materials is the indocarbazoles, such as 5,11-di-naphthyl-5,11-dihydroindolo[3,2-b]carbazole (NIC). Hole transport layer 50 can have a thickness ranging from about 1 nm to about 200 nm. According to another embodiment, the thickness ranges from about 5 nm to about 100 nm.

The OLEDs disclosed herein can comprise an electroluminescent layer. According to various embodiments, electroluminescent material layer 60 can comprise at least two materials having different electron and hole transport capacities. Materials that can be used in electroluminescent layer 60 include, but are not limited to, hole transport materials, electron transport materials, and bipolar transport materials. Various hole transport, electron transport, and bipolar transport materials are known in the art, as is their combined selection to achieve desired color emissions. Furthermore, selection of such materials to provide a desired color emission can be readily conducted by one of ordinary skill in the art through routine experimentation.

In various embodiments, electroluminescent layer 60 can comprise a hole transport material. Non-limiting examples of hole transport materials suitable for the electroluminescent layer include tertiary aromatic amines, polynuclear aromatic amines, carbazoles, and indocarbazole. For example, the electroluminescent layer 60 may comprise at least one of the hole transport materials identified herein as being suitable for the hole transport layer 50.

Electroluminescent layer 60 can also include at least one electron transport material, such as metal chelates like $AlQ_3$ and bis(8-hydroxyquinolato)-(4-phenylphenolato)aluminum (BAlQ), stilbenes like 4,4'-bis(2,2-diphenylvinyl)-1,1'-biphenyl (DPVBi), oxadiazoles like 2-(4-biphenyly1)-5-(4-tert-butylphenyl)-1,3,4-oxadiazole (PBD), and triazines such as 4,4'-Bis-[2-(4,6-diphenyl-1,3,5-triazinyl)]-1,1'-biphenyl (T1) including those triazines identified for the triazine electron transport layer. Illustrative examples of electron transport materials that can be used include, but are not limited to, the metal chelates of 8-hydroxyquinoline as disclosed in U.S. Pat. Nos. 4,539,507; 5,151,629; 5,150,006; and 5,141,671 (each of which is incorporated herein by reference). Illustrative examples include bis(8-hydroxyquinolato)-(4-phenylphenolato)aluminum (Balq); tris(8-hydroxyquinolinate) gallium; bis(8-hydroxyquinolinate) magnesium; bis(8-hydroxyquinolinate) zinc; tris(5-methyl-8-hydroxyquinolinate) aluminum; tris(7-propyl-8-quinolinolato) aluminum; bis[benzo{f}-8-quinolinate]zinc; bis(10-hydroxybenzo[h]quinolinate) beryllium; and the like.

Another suitable class of electron transport materials suitable for electroluminescent layer 60 comprises stilbene derivatives, such as those disclosed in U.S. Pat. No. 5,516,577, which is incorporated herein by reference. A suitable stilbene derivative is 4,4'-bis(2,2-diphenylvinyl)biphenyl. Yet another class of suitable electron transport materials is the metal thioxinoid compounds, illustrated in U.S. Pat. No. 5,846,666 (incorporated herein by reference). These materials include metal thioxinoid compounds of bis(8-quinolinethiolato)zinc; bis(8-quinolinethiolato)cadmium; tris(8-quinolinethiolato)gallium; tris(8-quinolinethiolato)indium; bis(5-methylquinolinethiolato)zinc; tris(5-methylquinolinethiolato)gallium; tris(5-methylquinolinethiolato)indium; bis(5-methylquinolinethiolato)cadmium; bis(3-methylquinolinethiolato)cadmium; bis(5-methylquinolinethiolato)zinc; bis[benzo{f}-8-quinolinethiolato]zinc; bis[3-methylbenzo{f}-8-quinolinethiolato]zinc; bis[3,7-dimethylbenzo{f}-8-quinolinethiolato]zinc; and the like. Additional suitable materials include bis(8-quinolinethiolato)zinc; bis(8-quinolinethiolato)cadmium; tris(8 quinolinethiolato)gallium; tris(8-quinolinethiolato)indium; and bis[benzo{f}-8-quinolinethiolato]zinc.

Still another class of suitable electron transport materials useful in the electroluminescent layer 60 is the oxadiazole metal chelates disclosed in U.S. Pat. No. 5,925,472 (incorporated herein by reference). These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato] zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis[2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato] zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxypheny)-1,3,4-oxadiazolato] zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato] beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1 naphthyl)1,3,4-thiadiazolato]zinc; and bis[2-(2-hydroxyphenyl)-5-(1-naphthyl)-1,3,4-thiadiazolato]beryllium, and the like.

In various embodiments, electroluminescent layer 60 can comprise a bipolar transport material, separately or in place of electron and/or hole transport materials. Suitable bipolar materials include anthracenes like 2-(1,1-dimethyethyl)-9,10-bis(2-naphthalenyl)anthracene (TBADN), 9,10-di-(2-naphthyl) anthracene (DNA), 9,10-di-(2-naphthyl) anthracene (DPA), 9-bis(phenyl) anthracene (BPA), Spiro-BPA and Spiro-DPA, perylenes, like 2,5,8,11-tetra-t-butylperylene (BD2), tetracenes like rubrene, and other hydrocarbon materials in general.

In various embodiments, electroluminescent layer 60 can comprise a mixture of at least two materials having different electron and hole transport capacities. The said two materials having different electron and hole transport capacities can be any two materials that have different hole mobilities and/or different electron mobilities. In general, a material is considered to be a hole transport material if its hole mobility is at least about 10 times higher than its electron mobility. In general, a material is considered to be an electron transport material if its electron mobility is at least about 10 times higher than its hole mobility. In general, a material is considered to be a bipolar transport material if its hole mobility is equal to its electron mobility, if its hole mobility exceeds its electron mobility by no more than 10 times, or if its electron mobility exceeds its hole mobility by no more than 10 times. The two materials having different electron and hole transport capacities can be independently selected from hole transport materials, electron transport materials and bipolar transport materials, illustrative examples of which have been given above. For example, both materials can be hole transport materials, both materials can be electron transport materials, both materials can be bipolar transport materials, one material can be a hole transport material and the other material can be an electron transport material, one material can be a hole transport material and the other material can be a bipolar transport material, or one material can be an electron transport material and the other material can be a bipolar transport material. In embodiments where the mixture comprises two hole transport materials, the two materials are selected such that the hole mobility of one material is at least two times higher than the hole mobility of the other material. In embodiments where the mixture comprises two electron transport materials, the two materials are selected such that the electron mobility of one material is at least two times higher than the electron mobility of the other material. In embodiments where the mixture comprises two bipolar transport materials, the two materials are selected such that the hole mobility of one material is at least two times higher than the hole mobility of the other material, and/or the electron mobility of one material is at least two times higher than the electron mobility of the other material. A mixed region can comprise from about 5 volume percent to about 95 volume percent of one of the said two materials, and from about 95 volume percent to about 5 volume percent of the other of the said two materials. A mixed region can further optionally comprise from about 0.01 volume percent to about 25 volume percent of a dopant material. In embodiments, a mixed region comprises from about 30 volume percent to about 70 volume percent of one of the said two materials, from about 70 volume percent to about 30 volume percent of the other of the said two materials, and can optionally further comprise from about 0.05 volume percent to about 10 volume percent of a dopant material. In other embodiments, a mixed region may comprise from about 40 volume percent to about 60 volume percent of one of the said two materials, from about 60 volume percent to about 40 volume percent of the other of the said two materials, and optionally from about 0.1 volume percent to about 2 volume percent of a dopant material. In other embodiments, a dopant material in a mixed region may be present in an amount from about 5 volume percent to about 20 volume percent.

Electroluminescent layer 60 can comprise at least one material capable of emitting light as a result of hole and electron recombination. The at least one material can be any fluorescent or phosphorescent material, or can be either one or both of the two materials having different electron and hole transport capacities. Alternatively, the at least one material capable of emitting light can be additional materials.

Electroluminescent layer 60 can comprise a fluorescent material. Illustrative examples of fluorescent materials include dyes selected, for example, from coumarin, dicyanomethylene pyranes, polymethine, oxabenzanthrane, xanthene, pyrylium, carbostyl, perylene, and quinacridone derivatives. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like. The fluorescent component can be present in an amount of, for example, from about 0.01 to about 10 weight percent, such as from about 1 to about 5 weight percent of the layer.

Electroluminescent layer 60 can comprise a phosphorescent material such as, for example, organometallic compounds containing a heavy metal atom that leads to strong spin-orbit coupling, such as those disclosed in Baldo et al., "Highly efficient organic phosphorescent emission from organic electroluminescent devices", Letters to Nature, 395, pp 151-154 (1998) (incorporated herein by reference in its entirety). Suitable non-limiting examples include 2,3,7,8,12,13,17,18-octaethyl-21H23H-phorpine platinum(II) (PtOEP) and tris(2-phenylpyridine)iridium.

In order to achieve a low driving voltage, the thickness of the electroluminescent layer can be from about 5 nm to about 50 nm. According to one embodiment, the thickness ranges from about 10 nm to about 40 nm. According to another embodiment, the thickness ranges from about 15 nm to about 30 nm.

The OLEDs disclosed herein can comprise an electron transport layer 70 comprising a triazine. There are a number of triazines suitable for forming electron transport layer 70. Suitable triazines include those disclosed in U.S. Pat. Nos. 6,225,467 and 6,229,012 (the disclosures of which are incorporated by reference herein). Non-limiting examples of suitable triazines include triphenyl triazine; 4,4'-bis[2-(4,6-diphenyl-1,3,5-triazinyl)]-1,1'-biphenyl (T1); 2,4,6-tris(4-biphenyl)-1,3,5-triazine; 2,4,6-tris[4-(4'-methylbiphenyl)]-1,3,5-triazine; 2,4,6-tris[4-(4'-tert-butylbiphenyl)]-1,3,5-triazine; 2,4,6-tris[4-(3',4'-dimethylbiphenyl)]-1,3,5-triazine; 2,4,6-tris[4-(4'-methoxybiphenyl)]-1,3,5-triazine; 2,4,6-tris[4-(3'-methoxybiphenyl)]-1,3,5-triazine; 2,4-bis(4-biphenylyl)-6-phenyl-1,3,5-triazine; 2,4-bis(4-biphenyl)-6-m-tolyl-1,3,5-triazine; 4,4'-bis-[2-(4,6-diphenyl-1,3,5-triazinyl)]-1,1'-biphenyl; 4,4'-bis-[2-(4,6-di-p-tolyl-1,3,5-triazinyl)]-1,1'-biphenyl; 4,4'-bis-[2-(4,6-di-m-tolyl-1,3,5-triazinyl)]-1,1'-biphenyl; 4,4'-bis-[2-(4,6-di-p-methoxyphenyl-1,3,5-triazinyl)]-1,1'-biphenyl; 4,4'-bis-[2-(4,6-di-m-methoxyphenyl-1,3,5-triazinyl)]-1,1'-biphenyl; 4,4'-bis-[2-(4, β-naphthyl-6-phenyl-1,3,5-triazinyl)]-1,1'-biphenyl; 4,4'-bis-[2-(4,6-di-biphenylyl-1,3,5-triazinyl)]-1,1'-biphenyl; 4-[2-(4,6-diphenyl-1,3,5-triazinyl)]-4'-[2-(4,6-di-m-tolyl-1,3,5-triazinyl)]-1,1'-biphenyl; 2,7-bis-[2-(4,6-di-phenyl-1,3,5-triazinyl)]fluorine; 2,7-bis-[2-(4,6-di-phenyl-1,3,5-triazinyl)]-9,9-dimethylfluorene; 2,7-bis-[2-(4,6-di-phenyl-1,3,5-triazinyl)]-9,9-diethylfluorene; 2,7-bis-[2-(4,6-diphenyl-1,3,5-triazinyl)]-9,9-diphenylfluorene; 2,7-bis-[2-(4,6-di-phenyl-1,3,5-triazinyl)]-9,10-dihydraphenanthrene; 4,9-bis-[2-(4,6-di-phenyl-1,3,5-triazinyl)]dibenzofuran, 4,9-bis-[2-(4,6-di-phenyl-1,3,5-triazinyl)]dibenzothiophene; 2,7-bis-[2-(4,6-di-phenyl-1,3,5-triazinyl)]-9,9-dimethyl-9-silafluorene; and the like. The electron transport layer can be composed entirely of the triazine, or it can include the triazine mixed with other materials. For example, the triazine can be doped with at least one of organic and inorganic materials, as described in U.S. patent application Ser. No. 11/122,290, filed on even date herewith (the disclosure of which is incorporated by reference herein). In certain embodiments, the electron transport layer 70 comprising a triazine can additionally comprise at least one of the electron transport materials disclosed to be useful in the electroluminescent layer 60. In certain embodiments, the electron transport layer 70 comprises the triazine in an amount of at least 50% by volume. In general, the thickness of the electron transport layer 70 ranges from about 1 nm to about 200 nm, such as from about 5 nm to about 100 nm, for example from about 20 nm to about 70 nm.

In various embodiments, the OLEDs include a cathode 80. The cathode 80 can comprise any suitable material such as a metal. The material can have high work function component, for example an eV of from about 4.0 eV to about 6.0 eV. The cathode can comprise a low work function component, such as metals with, for example, an eV of from about 2.5 eV to about 4.0 eV. The cathode can be derived from a combination of a low work function metal (about 4 eV, for example from about 2 eV to about 4 eV) and at least one other metal.

Effective proportions of the low work function metal to the second or additional metal are from less than about 0.1 percent to about 99.9 percent by weight. Illustrative examples of low work function metals include alkaline metals such as lithium or sodium, Group IIA or alkaline earth metals such as beryllium, magnesium, calcium, or barium, and Group III metals including rare earth metals and the actinide group metals such as scandium, yttrium, lanthanum, cerium, europium, terbium, or actinium. Lithium, magnesium and calcium are suitable low work function metals.

The thickness of cathode 80 can range from, for example, about 10 nm to about 500 nm. The Mg:Ag cathodes of U.S. Pat. No. 4,885,211 (the disclosure of which is incorporated herein by reference), constitute one suitable cathode construction. Another suitable cathode is described in U.S. Pat. No. 5,429,884 (the disclosure of which is totally incorporated herein by reference), wherein the cathode is formed from lithium alloys with other high work function metals such as aluminum and indium.

The OLEDs disclosed herein can be constructed by conventional methods. In various embodiments, a supporting substrate 20, such as glass, is provided. An anode 30 can be disposed over the glass and can be comprised of, for example, indium tin oxide in a thickness of from about 1 to about 500 nm, for example from about 30 to about 100 nm (throughout the disclosure, thickness ranges for each layer are provided as examples—other suitable thickness can be selected). A buffer layer 40 in contact with the anode can optionally be provided, and can be comprised of a conductive component or hole transport materials having a thickness of from about 5 to about 500 nm, for example from about 10 to about 100 nm. An organic hole transporting layer 50 can be disposed over the anode 30 or the buffer layer 40 and in a thickness of from about 1 to about 200, for example from about 5 to about 100 nm. An electroluminescent layer 60 can be provided in contact with the hole transporting layer 50. An electron transport layer 70 can be provided in contact with the electroluminescent layer 60 in a thickness of from about 5 to about 300 nm, for example from about 10 to about 100 nm. A cathode 80 comprising, e.g., a low work function metal can be in contact with the electron transporting layer 70.

According to the present disclosure, embodiments of the OLEDs disclosed herein can be operated under alternating current (AC) and/or direct current (DC) driving conditions. In some cases, AC driving conditions can be suitable to provide extended operational lifetimes, especially in high temperature device operating conditions. Suitable operating voltages are externally-applied driving voltages required to drive sufficient current to obtain a luminance of at least about 100 cd/m$^2$, and typically a luminance of at least about 500 cd/m$^2$, such as, for example a luminance of about 1000 cd/m$^2$. Such voltages can range, for example, from about 0.5 volts to about 20 volts, such as from about 1 volt to about 15 volts. According to various embodiments, the operating voltage is less than about 6 volts, for example less than about 5.5 volts. Suitable driving currents range, for example, from about 1 to about 1000 mA/cm$^2$, such as from about 10 mA/cm$^2$ to about 200 mA/cm$^2$, for example about 25 mA/cm$^2$. Driving voltages and currents outside these ranges can also be used.

EXAMPLES

The following examples are illustrative and are non-limiting to the present teachings.

A group of organic light emitting devices was fabricated using physical vapor deposition. All devices comprised an indium tin oxide anode coated on a glass substrate and a Mg:Ag cathode. All devices had a three-layer light emitting region disposed between the anode and the cathode, which comprised hole transporting layers, electroluminescent layers and electron transporting layers of various compositions as described in the table below. Following fabrication, the devices were operated at a constant current of 25 mA/cm$^2$. The driving voltage and brightness of each of the devices at this current were measured. The devices were then operated at a constant current of 31.25 mA/cm$^2$, and the time elapsed before the luminance decreased to 50% of the initial luminance (Lo), denoted by $t_{1/2}$, was measured. The half-life ($t_{1/2}$) from an initial luminance of 500 cd/m$^2$ was then calculated.

| Device No. | HTL[1] | EL[2] | ETL[3] | Efficiency at 25 mA/cm$^2$ | | | Stability at 31.25 mA/cm$^2$ | | Calculated $t_{1/2}$ in hours for initial luminance of 500 cd/m$^2$ |
|---|---|---|---|---|---|---|---|---|---|
| | | | | Brightness (cd/m$^2$) | Driving Voltage (V) | CIE Coordinates (color) | Initial Brightness (Lo) (cd/m$^2$) | $t_{1/2}$ (hrs) | |
| 1 | NPB[4] + 5% Rubrene (40 nm) | BH2[5] + 2% BD2[6] (10 nm) | T1 (45 nm) | 576 | 4.46 | 0.200, 0.265 (blue) | 703 | 400 | 560 |
| 2 | NPB + 5% Rubrene (40 nm) | BH2 + T1[7] (9:1) + 2% BD2 (10 nm) | T1 (45 nm) | 684 | 4.19 | 0.280, 0.346 (white) | 830 | 700 | 1160 |
| 3 | NPB + 5% Rubrene (40 nm) | BH2 + T1(3:1) + 2% BD2 (10 nm) | T1 (45 nm) | 622 | 3.8 | 0.389, 0.451 (yellow) | 1150 | 800 | 1840 |
| 4 | NPB (40 nm) | AlQ$_3$[8] + 2% Rubrene (10 nm) | T1 (45 nm) | 1230 | 3.62 | 0.480, 0.511 (yellow) | 1580 | 150 | 475 |
| 5 | NPB (40 nm) | AlQ$_3$ + NPB (1:1) + 2% Rubrene (10 nm) | AlQ$_3$ (45 nm) | 790 | 5.7 | 0.478, 0.517 (yellow) | — | — | — |
| 6 | NPB (40 nm) | AlQ$_3$ + NPB (4:1) + 2% Rubrene (10 nm) | T1 (45 nm) | 997 | 3.32 | 0.478, 0.518 (yellow) | 1320 | 700 | 1850 |
| 7 | NPB (40 nm) | AlQ$_3$ + NPB (1:1) + 2% Rubrene (10 nm) | T1 (45 nm) | 793 | 3.03 | 0.466, 0.529 (yellow) | 1360 | 500 | 1360 |
| 8 | NPB (40 nm) | AlQ$_3$ + NPB (1:1) + 2% Rubrene (10 nm) | T1 (45 nm) | 1330 | 3.6 | 0.466, 0.520 (yellow) | 1570 | 350 | 1100 |
| 9 | NPB (40 nm) | AlQ$_3$ + NPB (1:4) + 2% Rubrene (10 nm) | T1 (45 nm) | 944 | 3.27 | 0.462, 0.530 (yellow) | 1150 | 650 | 1500 |

[1]Hole transport layer
[2]Electroluminescent layer
[3]Electron transport layer
[4]N,N'-di(naphthalene-1-yl)-N,N'-diphenyl-benzidene
[5]2-t-butyl-9,10-di-(2-naphthyl) anthracene (also referred to as TBADN)
[6]2,5,8,11-tetra-t-butylperylene
[7]4,4'-bis[2-(4,6-diphenyl-1,3,5-triazinyl)]-1,1'-biphenyl
[8]tris(8-hydroxyquinoline) aluminum Comparative devices 1 and 4 exhibit low stability since the electroluminescent layer contains only BI-12 and AlQ$_3$, respectively, and no second host material. Comparative device 5 has a driving voltage exceeding 5V, likely because the electron transport layer does not comprise a triazine. By contrast, inventive devices 2, 3, and 6-9 have mixed electroluminescent layers, demonstrate a half life greater than 1000 hours, and have a driving voltage of less than 5V.

From the results, it is clear that unlike the comparative devices, OLEDs according to embodiments of the present invention can demonstrate both low driving voltage (less than 5 V) and sufficient operational stability (a half-life greater than 1000 hours for an initial brightness of at least 500 cd/m$^2$. The embodiments can also be utilized in OLEDs of various compositions in order to obtain different devices with different emission colors.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "a dopant" includes two or more dopants. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A display comprising at least one organic light emitting device comprising:
   (a) an anode;
   (b) a hole transport layer adjacent to and in contact with the anode, the hole transport layer including N,N'-di(naphthalene-1-yl)-N,N'-diphenyl-benzidene;
   (c) an electroluminescent material layer comprising at least two materials having different electron and hole transport capacities;
   (d) an electron transport layer is composed entirely of 4,4'-bis[2-(4,6-diphenyl-1,3,4-triazinyl)]-1,1'-biphenyl; and
   (e) a cathode,
   wherein said electroluminescent material layer has a thickness of less than 50 nm and wherein said device is capable of having an operational stability characterized by a half life of at least 1000 hours at an initial brightness of at least 500 cd/m2 by operating at a driving voltage of less than 5V at a current density of at least 20 mA/cm2,
   wherein the electroluminescent material layer consists essentially of tris(8-hydroxyquinoline) aluminum, N,N'-di(naphthalene-1-yl)-N,N'-diphenyl-benzidene, rubrene and at least one of fluorescent and phosphorescent materials.

* * * * *